United States Patent [19]

Gontowki, Jr.

[11] Patent Number: 5,192,901

[45] Date of Patent: Mar. 9, 1993

[54] SHORT CIRCUIT PROTECTION

[75] Inventor: Walter S. Gontowki, Jr., Thompson, Conn.

[73] Assignee: Cherry Semiconductor Corporation, East Greenwich, R.I.

[21] Appl. No.: 494,605

[22] Filed: Mar. 16, 1990

[51] Int. Cl.$^5$ .............................................. H02K 17/34
[52] U.S. Cl. ................................ 318/430; 318/294; 318/635; 361/98
[58] Field of Search .............................. 318/430–434, 318/280–294; 361/18–38, 78–111; 388/810–830

[56] References Cited

U.S. PATENT DOCUMENTS

| | | | |
|---|---|---|---|
| 3,868,554 | 2/1975 | Konrad | 318/434 |
| 4,017,765 | 4/1977 | Maisch | 361/88 |
| 4,270,164 | 5/1981 | Wyman et al. | 318/635 X |
| 4,275,340 | 6/1981 | Schleupen | 318/294 X |
| 4,291,357 | 9/1981 | Hong | 361/92 X |
| 4,336,562 | 6/1982 | Kotowski | 318/294 X |
| 4,439,806 | 3/1984 | Brajder | 361/98 |
| 4,555,742 | 11/1985 | Gray et al. | 361/101 X |
| 4,562,387 | 12/1985 | Lehnhoff | 318/294 X |
| 4,570,198 | 2/1986 | Storti et al. | 361/98 X |
| 4,611,154 | 9/1986 | Lambropoulos et al. | 318/434 |
| 4,633,358 | 12/1986 | Nagano | 318/434 X |
| 4,644,255 | 2/1987 | Freymuth | 318/139 |
| 4,658,203 | 4/1987 | Freymuth | 323/282 |
| 4,725,765 | 2/1988 | Miller | 318/434 |
| 4,791,522 | 12/1988 | Bergh | 361/98 X |
| 4,849,850 | 7/1989 | Brahms | 361/101 |
| 4,858,053 | 8/1989 | Profio | 361/23 |
| 4,860,154 | 8/1989 | Fazlollahi | 361/101 |
| 4,893,211 | 1/1990 | Bynum et al. | 361/18 |
| 4,901,366 | 2/1990 | Rottger | 388/811 |
| 4,924,158 | 5/1990 | Kelley et al. | 318/293 X |
| 4,954,917 | 9/1990 | Wirth | 361/98 |
| 4,959,601 | 9/1990 | Kikugawa | 318/685 X |
| 4,972,133 | 11/1990 | Hirota et al. | 318/646 |
| 4,980,838 | 12/1990 | Daggett et al. | 318/568.16 |
| 4,985,666 | 1/1991 | Nakabayashi | 318/293 X |
| 5,077,824 | 12/1991 | Nagata et al. | 388/819 |

Primary Examiner—Paul Ip
Attorney, Agent, or Firm—Robert M. Asher

[57] ABSTRACT

In the transistor power output stages disclosed herein, short-circuit protection is provided with respect to output terminals through which a reversible motor or other load is to be energized. An output stage connected between the load and one of the supply leads provides current gain for energizing the load at a current level which is a function of the level of drive current provided to the output stage. Drive current is provided only at a first level independently of the voltage at the output terminal and a sensing means provides drive current at an increased level when the voltage at the output terminal is in a normal range, e.g. close to the voltage at the respective supply lead.

8 Claims, 4 Drawing Sheets

SHORT CIRCUIT PROTECTION

BACKGROUND OF THE INVENTION

The present invention relates to the protecting of power output stages and more particularly to the protection of transistor output circuits which are normally employed for driving reversible motors or other loads needing high initial current.

In transistor power output stages for driving reversible motors, there are typically provided four output transistors which are connected in an H pattern so that, by turning on diagonal pairs, current may be applied through the motor in either direction. To prevent destruction of the output transistors if there is a short in the load or if either output terminal is accidentally shorted to the opposite power rail, the output transistors are typically operated in either a constant current mode or the driver circuits employ current sensing so that the total power dissipation in the output device is limited to a safe level taking into consideration of the packaging used to house the circuitry and the thermal resistance of the package.

A conflicting need is the requirement of supplying substantially higher current during starting of the motor than is required during running. It is advantageous to be able to provide a current up to an order of magnitude greater than the normal running current to obtain fast startup. Such current levels are far in excess of those which could be tolerated during a short circuit. Accordingly, it has heretofore been necessary to sacrifice either complete short circuit protection or the availability of high startup current.

Among the several objects of the present invention may be noted the provision of novel transistor power output stages; the provision of such power output stages which are suitable for driving reversible electric motors the provision of such output stages which will provide high levels of startup current to an electric motor; the provision of such output stages which afford short circuit protection with respect to the output terminals connected to the motor; the provision of such output stages which may be implemented in an integrated circuit; the provision of such output stages which are highly reliable and which are of relatively simple and inexpensive construction. Other objects and features will be in part apparent and in part pointed out hereinafter.

SUMMARY OF THE INVENTION

In the transistor power circuitry of the present invention, an output means connected between the load and one of the supply leads provides current for energizing the load at a current level which is a function of the level of drive current provided to the output means. Drive current is provided only at a first level independently of the voltage at the output terminal and a supplemental means provides drive current at an increased level when the voltage at the terminal is in a normal range, for example, is close to that on the one supply lead.

BRIEF DESCRIPTION OF THE DRAWINGS

Corresponding reference characters indicated corresponding parts throughout the several views of the drawings.

DESCRIPTION OF THE PREFERRED EMBODIMENTS

Figure 1:
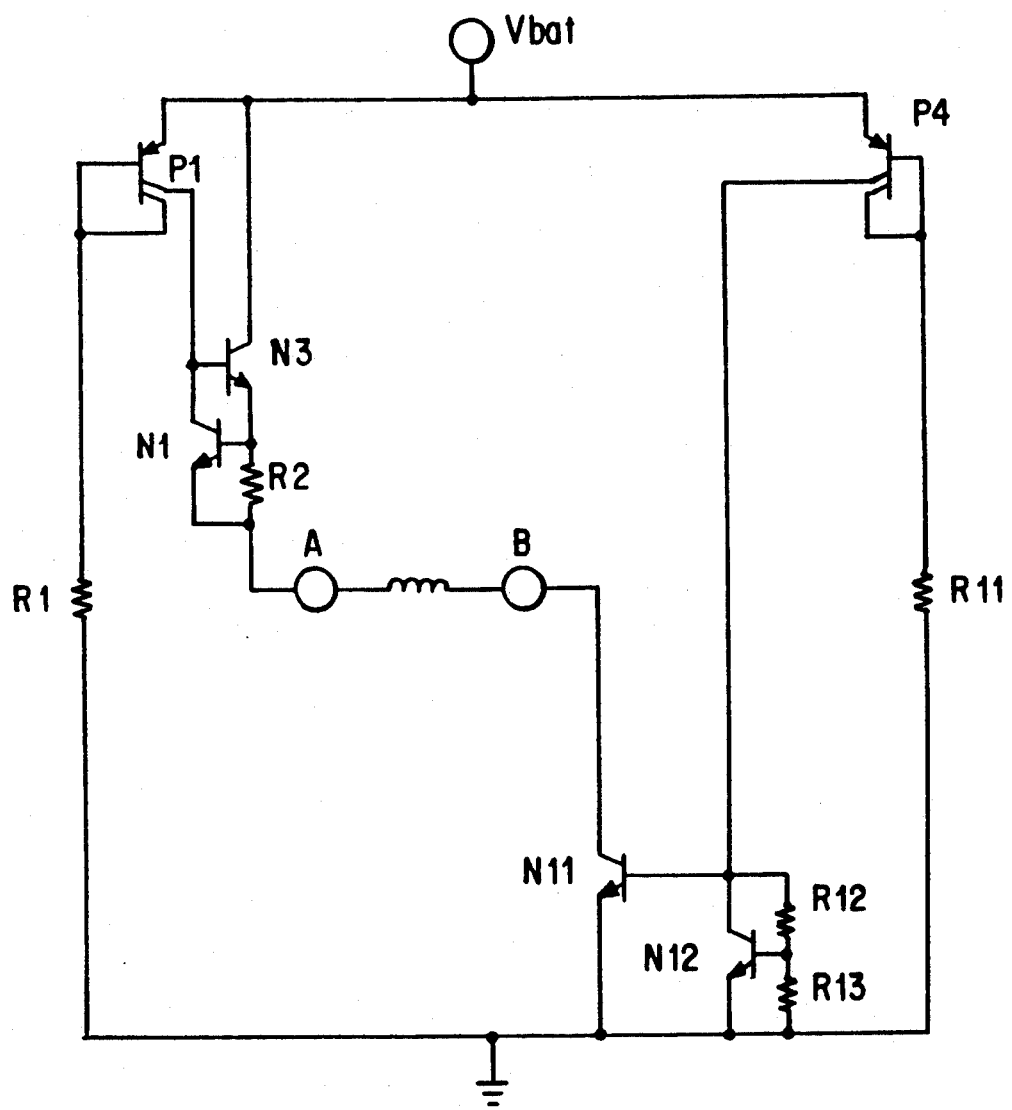
FIG. 1 is a schematic circuit diagram of a typical power output stage in accordance with the prior art implementing short circuit protection by current limiting.

FIG. 1 illustrates typical prior art circuitry employing current limiting for implementing short-circuit protection. In FIG. 1 and in several of the FIGURES of the invention, only a diagonal pair of output stages is shown so as not to clutter the drawings. It should, however, be understood that the actual integrated circuit implementation will typically employ four output stages connected in an H pattern so that the motor can be reversed by turning on the appropriate diagonal pair of output circuits. Similarly, the gating circuits which turn on the output stages are omitted. Typically, the output stages are turned off by shunting drive current away from the base terminal of the output transistor as is well understood by those skilled in the art.

In each of the FIGURES the output terminals are designated by reference characters A and B. The motor winding or other load is connected between these terminals. In the circuitry of FIG. 1, the A output terminal can be connected to or energized from the positive supply lead 11 through an output transistor N3, there being a series current sensing resistor R2. Output transistor N3 can be biased into conduction by means of a PNP transistor P1 which has dual collectors and is connected as a current. mirror. The current mirror P1 is, inturn, biased with a set level current through resistor R1.

A current sensing transistor N1 responds to the voltage across R2 to selectively shunt drive current away from the output transistor N2. Thus, if output terminal A were accidentally shorted to the negative supply lead (ground), the current flowing through resistor R2 would turn on the transistor N1 which would in turn reduce the drive to transistor N2 and thus limit the total current drawn. As indicated previously, the value to which the current limited is typically selected in relation to the thermal characteristics of the package within which the output transistors are encapsulated.

Correspondingly, the output terminal B can be connected to or energized from the negative supply lead through an output transistor N11. A PNP transistor P4, connected as a current mirror similar to P1, provides drive current to output transistor N11. The base emitter junction of transistor N11 is shunted by a transistor N12 which is connected as a $V_{be}$ multiplier with resistors R12 and R13. The voltage at the collector of transistor N12 is thus a function of the current flowing through N12, its geometry and the ratio of R3 and R4. By applying this voltage to the base emitter junction of N3, the maximum current through N3 is well controlled to a selected value. However, as indicated previously, the current value which must be selected in order to provide short-circuit protection is substantially below that which would be desired for startup current in many circumstances.

Figure 2:
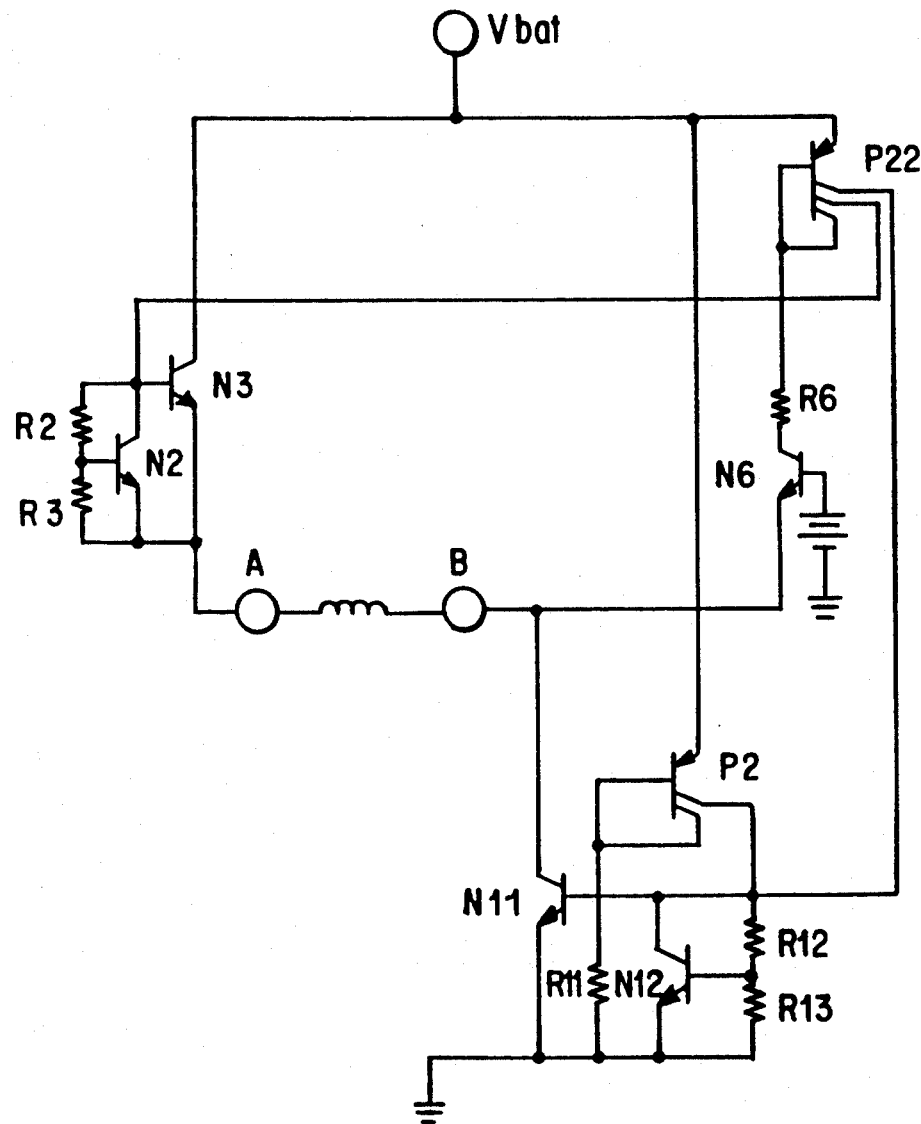
FIG. 2 is a schematic circuit diagram of output circuitry in accordance with the present invention providing voltage sensing at one of the pair of output terminals.

In the embodiment of the invention illustrated in FIG. 2, many of the components correspond with components in the circuit of FIG. 1 and, accordingly, the same reference characters have been used. In the circuitry of FIG. 2, the bias current for the positive output stage comprising transistor N3 is drawn from the middle one of the three collectors of a PNP transistor P22. Transistor P22 is configured as a current mirror, one of its collectors being connected to its base. Also, the current sensing resistor is omitted and, instead, the base emitter junction of output transistor N3 is shunted by a $V_{be}$ multiplier comprising transistor N2 and resistors R2, R3 so as to configure the output stage as a current source.

Drive current is provided to the PNP transistor P22 from an NPN transistor N6 through a current limiting resistor R6. The emitter of transistor N6 is connected to sense the voltage on the output terminal B. A preselected reference voltage which is intermediate the positive and negative supply leads is applied to the base of transistor N6. The third collector of transistor P22 is connected to the $V_{be}$ multiplier transistor N12 and to the base of output transistor N11 so as to selectively provide drive current to that output stage in addition to the drive current provided by the transistor P2.

When the output stages of the circuitry of FIG. 2 are turned on, the transistor P2 acts as a current source forcing a fixed current into the $V_{be}$ multiplier transistor N12. This reference current is then converted to a higher current by the current gain to the output transistor N12. The value of this initial current is chosen commensurate with the power handling capabilities of the package as described previously. Thus, if the output terminal B were shorted to the positive supply lead, the maximum current which can flow through the transistor N11 is the amount selected as the initial current.

Assuming that no short-circuit is present, however, the collector of transistor N11 will approach the negative supply voltage, i.e. ground. Once the voltage at terminal B goes more than one $V_{be}$ drop below the reference voltage, the transistor N6 will conduct. Conduction through transistor N6 causes current to be mirrored through PNP transistor P22, the magnitude of this current being a function of the value of resistor R6. This causes a corresponding or proportional current to flow through each of the collectors of the PNP transistor P22, the magnitudes of these currents being also a function of the resistance value of R6 as well as the geometry of the transistor P22, i.e. the relative sizes of its several collectors. The current from the second collector of transistor P22 energizes the positive output stage comprising transistors N2 and N3 while the current through the third collector increases the drive to the output transistor N11. By appropriately selecting the ratios of the several collector areas of PNP transistor P22, the current passed by drive output transistor N11 can be increased to easily handle the desired startup current of the motor.

In the configuration of FIG. 2 and under the conditions stated thus far, the current through transistor N3 will be limited to a safe condition determined by the packaging parameters should the output A be shorted to ground.

Figure 3:
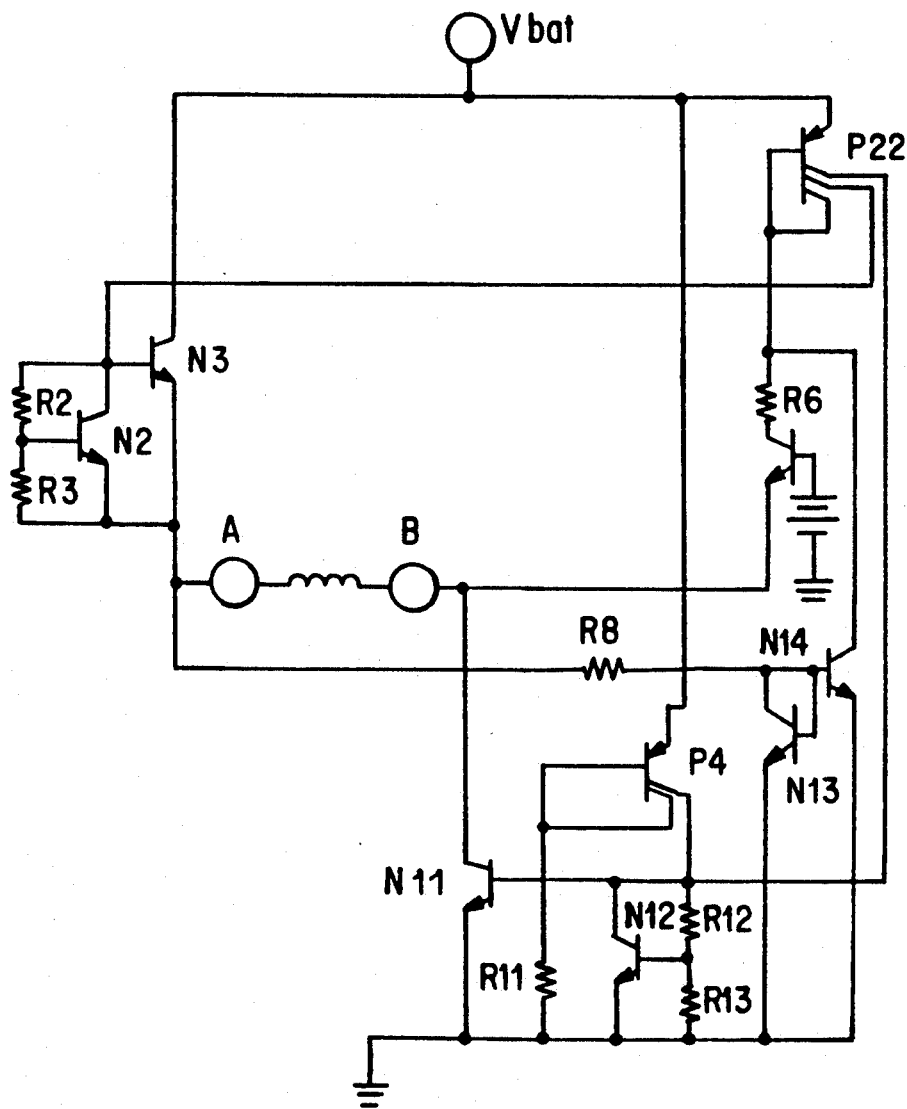
FIG. 3 is a schematic circuit diagram of output circuitry in accordance with the present invention implementing voltage sensing at both output terminals for energization in one direction.

The embodiment of FIG. 3 implements additional circuitry for sensing that the voltage at the terminal A is in an appropriate region. Terminal A is connected, through a resistor R8, to a current mirror comprising NPN transistors N13 and N14. The collector of transistor N14 is connected to the base of the PNP transistor P22 to provide additional drive current thereto in addition to that provided by the transistor N6. Assuming that no short-circuit is present and the energization has proceeded as described previously, the voltage at the terminal A will rise quickly. As this voltage rises, current starts flowing into the current mirror transistors N13 and N14 and this input current then causes additional current to flow out of the second and third collectors of the transistor P22 causing a further rise in the voltage at output terminal A. This regenerative action cause the output current to quickly increase and to cause the motor to come up to speed eventually allowing the load current to stabilize at its nominal value.

The sequential action just described takes place in a relatively short time and does not introduce any abnormal side effects with respect to the normal operation of the motor drive. If, after the motor has been operational, a fault condition appears, e.g. a short to ground, then the output circuitry quickly reverts to the appropriate current foldback condition to safely limit the output current.

Figure 4:
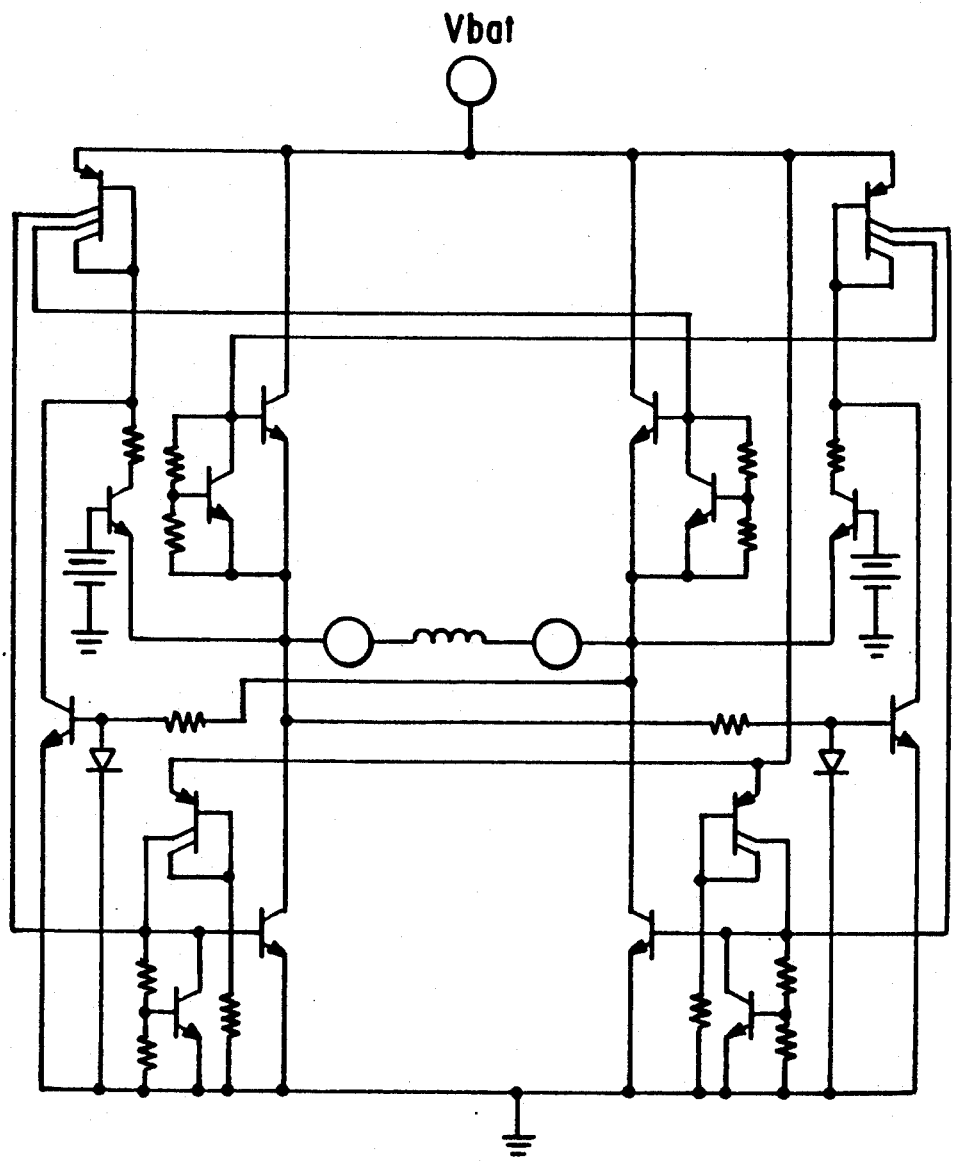
FIG. 4 is a schematic circuit diagram of power output circuitry in accordance with the present invention providing reversible motor energization with voltage sensing at both output terminals.

As indicated previously, a normal implementation of a reversible motor drive will comprise four output stages connected in an H configuration so that reversible operation of the motor is obtained. FIG. 4 illustrates a complete such circuit in which the upper and lower driver circuits of FIG. 3 have been replicated in the diagonal location so as to provide reversible operation. Since the circuitry is symmetrical, operation in the opposite motor direction is essentially identical to the sequence described above.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. Transistor power output stage for driving an electric motor load characterized by having two sides from a pair of supply leads comprising:
   first output transistor means connected between one side of the load and one of said supply leads providing current gain for energizing said load at a current level which is a function of the level of drive current provided to said output transistor means;
   second output transistor means connected between the other side of the load and the other one of said supply leads and providing current gain for energizing said load;
   means for providing drive current to said first output transistor means only at a first level which is independent of the voltage at said one side of the load; and
   voltage sensing means for providing drive current at a level which is substantially greater than said first level to said first output transistor means when the voltage at said one side of said load is close to that on said one supply lead and for also providing drive current to said second output transistor means.

2. An output stage as set forth in claim 1 wherein said voltage sensing means includes a first transistor which is biased into conduction when the voltage at said one side of the load crosses a preselected threshold.

3. An output stage as set forth in claim 2 wherein said voltage sensing and drive current providing means includes a current mirror which is biased into conduction by said first transistor.

4. An output stage as set forth in claim 3 wherein said current mirror comprises a transistor which is complementary in conductivity type to said first transistor and which includes plural collectors one of which provides current to said first output means and another of which provides current to said second output means.

5. Transistor power output stage for driving an electric load characterized by having two sides from a pair of supply leads, said output stage comprising:
   first output transistor means connected between one side of the load and one of said supply leads and providing current gain for energizing said load at a current level which is a function of the level of drive current provided to said output transistor means;
   means for providing drive current to said first output transistor means only at a first level which is independent of the voltage at said one side of the load;
   sensing means for providing drive current to said first output transistor means at a level which is substantially greater than said first level when the voltage at said one side of the load is close to that on said one supply lead, and
   second output transistor means connected between the other side of the load and the other one of said supply leads providing current gain for energizing said load at a current level which is a function of the level of drive current provided to said second output transistor means, said sensing means being operative to provide drive current to said second output transistor means when providing increased drive current to said first output transistor means.

6. An output stage as set forth in claim 5 further comprising a second providing means for sensing drive current at a further increased level when the voltage at the other side of the load is close to that on the other supply lead.

7. Transistor power output stage for driving a reversible electric motor load from a pair of supply leads, said output stage comprising:
   first output transistor means connected between one side of the load and one of said supply leads and providing current gain for energizing said load at a current level which is a function of the level of drive current provided to said output transistor means;
   second output transistor means connected between the other side of the load and the other one of said supply leads providing current gain for energizing said load at a current level which is a function of the level of drive current provided to said second output transistor means;
   means selectively operable for motor operation in a first direction for providing drive current to said first output transistor means only at a first level which is independent of the voltage at said one side of the load;
   sensing means for providing drive current to said first output transistor means at a level which is substantially greater than said first level when the voltage at said one side of the load is close to that on said one supply lead, said sensing means being operative to provide drive current to said second output transistor means when providing increased drive current to said first output transistor means;
   third output transistor means connected between said other side of the load and said one of said supply leads and providing current gain for energizing said load at a current level which is a function of the level of drive current provided to said third output transistor means;
   fourth output transistor means connected between said one side of the load and said other one of said supply leads providing current gain for energizing said load at a current level which is a function of the level of drive current provided to said second output transistor means;
   means selectively operable for motor operation in an opposite direction for providing drive current to said third output transistor means only at a respective level which is independent of the voltage at said other side of the load;
   second sensing means for providing drive current to said third output transistor means at a level which is substantially greater than said respective level when the voltage at said one side of the load is close to that on said one supply lead, said second sensing means being operative to provide drive current to said fourth output transistor means when providing increased drive current to said third output transistor means.

8. An output stage as set forth in claim 7 further comprising third sensing means for providing drive current to said first output transistor means at a further increased level when the voltage at said other side of the load is close to that at said other supply lead and fourth sensing means for providing drive current to said third output transistor means at a further increased level when the voltage at said one side of the load is close to that at said one supply lead.

* * * * *

UNITED STATES PATENT AND TRADEMARK OFFICE
CERTIFICATE OF CORRECTION

PATENT NO. : 5,192,901
DATED : March 9, 1993
INVENTOR(S) : Gontowski, Walter S.

It is certified that error appears in the above—identified patent and that said Letters Patent is hereby corrected as shown below:

Title page, item [19] "Gontowki, Jr." should read --Gontowski, Jr.-- and in item (75) Inventor: "Walter S. Gontowki" should read "Walter S. Gontowski"

col. 5, line 46: "a second providing means for sensing" should read "a second sensing means for providing"

Signed and Sealed this

Twelfth Day of April, 1994

*Attest:*

BRUCE LEHMAN

*Attesting Officer*   *Commissioner of Patents and Trademarks*